United States Patent [19]

Matsumoto et al.

[11] Patent Number: 5,171,706
[45] Date of Patent: Dec. 15, 1992

[54] METHOD FOR THE PRODUCTION OF A SEMICONDUCTOR LASER DEVICE

[75] Inventors: Mitsuhiro Matsumoto, Tenri; Kazuaki Sasaki, Yao; Masaki Kondo, Nara, all of Japan

[73] Assignee: Sharp Kabushiki Kaisha, Osaka, Japan

[21] Appl. No.: 739,767

[22] Filed: Aug. 1, 1991

[30] Foreign Application Priority Data

Aug. 1, 1990 [JP] Japan .................. 2-205507

[51] Int. Cl.$^5$ .................. H01L 21/203; H01L 33/00; H01S 3/025
[52] U.S. Cl. .................. 437/129; 437/107; 437/946
[58] Field of Search .............. 437/247, 129, 235, 225, 437/946, 105, 107; 372/43, 46

[56] References Cited

U.S. PATENT DOCUMENTS

| | | | |
|---|---|---|---|
| 4,751,201 | 6/1988 | Nottenburg et al. | 437/225 |
| 4,843,037 | 6/1989 | Yablonovitch et al. | 437/235 |
| 4,871,692 | 10/1989 | Lee et al. | 437/235 |

FOREIGN PATENT DOCUMENTS 0381521 8/1990 European Pat. Off.
59-46113 11/1984 Japan.

OTHER PUBLICATIONS

Sin et al., "Surface and Bulk Leakage Currents in Transverse Junction Stripe Lasers", J. Appl. Phys., vol. 69, No. 2, Jan. 15, 1991, pp. 1081–1090.
Tamanuki et al., "Ammonium Sulfide Passivation for AlGaAs/GaAs Buried Heterostructure Laser Fabrication Process", Jap. J. Appl. Phys., vol. 30, No. 3, Mar. 1991, pp. 499–500.
Y. Uchida et al., Preprint for the 32nd Annual Meeting of the Society of Applied Physics, Spring 1985, (1p-Z-B-8).
Y. Wada., Preprint for the 45th Annual Meeting of the Society of Applied Physics, Autumn 1984, (13p-R-5).
Patent Abstracts of Japan, vol. 12, No. 108, (E-597) (Apr. 7, 1988) corresponding to Japanese Patent Publication no., JP62238678.
Kawanishi et al., *Japanese Journal of Applied Physics* (Aug. 28–30, 1989) Extended Abstracts of the 21st Conference on Solid State Devices and Materials, Tokyo, Japan, pp. 337–340.
Patent Abstracts of Japan, Vol. 13, No. 232 (E-765) (May 29, 1989) corresponding to Japanese Patent Publication No. JP1039789.
Patent Abstracts of Japan, vol. 9, No. 189, (E-333) (Aug. 6, 1985) corresponding to Japanese Patent Publication No. JP60058692.
Patent Abstracts of Japan, vol. 11, No. 119, (E-499) (Apr. 14, 1987) corresponding to Japanese Patent Publication No. JP61265888.
Oigawa et al., Proceedings of the International Conference on Solid State Devices and Materials, (Aug. 24–26, 1988), Tokyo, Japan, pp. 263–266.
Oigawa et al., *Japanese Journal of Applied Physics* (Mar. 1989) 28(3):340–342.

*Primary Examiner*—Mary Wilczewski
*Attorney, Agent, or Firm*—Morrison & Foerster

[57] ABSTRACT

There is provided a method for the production of a semiconductor laser device which emits laser light from a facet. The method includes the steps of: growing a multi-layered structure containing an active layer for laser oscillation on a semiconductor substrate to form a wafer; etching the multi-layered structure to form a striped groove perpendicular to the direction of an optical waveguide, resulting in a pair of resonator facets; bringing the facets into contact with a sulfur-containing solution; subjecting the facets to heat treatment; growing a semiconductor layer on the surface of the facets, which has a band gap greater than that of the active layer; and cleaving the wafer along the striped groove to obtain a semiconductor laser device.

6 Claims, 3 Drawing Sheets

METHOD FOR THE PRODUCTION OF A SEMICONDUCTOR LASER DEVICE

BACKGROUND OF THE INVENTION

1. Field of the Invention

This invention relates to a method for the production of a semiconductor laser device which emits laser light from an end facet thereof, and more particularly, it relates to an improved method for the production of such a semiconductor laser device which can attain high reliability even when operated at a high output power level for a long period of time.

2. Description of the Prior Art

A semiconductor laser device which emits laser light from an end facet thereof is a typical example of the semiconductor devices produced by use of the cleavage of semiconductor crystals. A semiconductor laser device of this type has a Fabry-Perot resonator having a pair of semiconductor facets and functioning on the basis of the difference in refractive index between the semiconductor crystals and the air outside the device.

In recent years, semiconductor laser devices such as described above have widely come into practical use as light sources for optical disc driving units and the like. When semiconductor laser devices are used as the light sources for write-once optical disc driving units or re-writable optical disc driving units, they are required to have high reliability even at a high output power level of about 40 to 50 mW. Furthermore, for the purpose of attaining higher operational speed of an entire system including an optical disc driving unit, there is a demand for semicopnductor laser devices which can attain laser oscillation at a still higher output power level. When semiconductor laser devices are used as the light sources for high-resolution laser printers or for optical pumping of solid state laser devices such as a YAG laser, they are required to attain laser oscillation at an output power level of 100 mW or more.

The high output power operation of such a semiconductor laser device, however, causes the deterioration of its end facet from which laser light is emitted. The deterioration in the light-emitting facet increases the current required for driving the semiconductor laser device, and eventually it becomes impossible for the laser device to attain laser oscillation. Therefore, with respect to semiconductor laser devices, it is difficult to attain high reliability at a high output power level.

The principal cause for the deterioration of the light-emitting facet is now described. First, heat is generated locally at the light-emitting facet due to the high optical density at this facet and also due to non-radiative re-combination caused by the surface state. As the temperature in the area near the facet increases, the band gap in that area becomes smaller, which in turn increases the absorption of light. The increase in the light absorption generates carriers, which are then trapped in the surface state, and nonradiative recombination of the carriers occurs. This further generates heat in the area near the light-emitting facet. This process is repeated until the temperature in the area near the facet reaches the melting point of the semiconductor, resulting in facet breakdown.

For the prevention of such deterioration in the resonator facet, there has been proposed a semiconductor laser device having a semiconductor layer with a band gap larger than that of an active layer (i.e., a large-band-gap layer) formed on the facet.

In the production of such a semiconductor laser device, resonator facets are first formed on a single wafer, and then large-band-gap layers such as mentioned above are formed on the facets.

For example, in a conventional method for producing this type of semiconductor laser device, resonator facets are formed on a wafer by dry etching, after which semiconductor layers having a band gap larger than that of an active layer are formed on the resonator facets. This process will be described in detail below.

FIGS. 2a to 2c are sectional views of a wafer taken along the direction of an optical waveguide, in the steps of the conventional method for producing a semiconductor layer device with a large-band-gap layer.

First, as shown in FIG. 2a, on an n-GaAs substrate 101, an n-Al$_{0.33}$Ga$_{0.67}$As first cladding layer 102, an n-Al$_{0.08}$Ga$_{0.92}$As active layer 103, a p-Al$_{0.33}$Ga$_{0.67}$As second cladding layer 104, and a GaAs contact layer 105 are successively grown by epitaxy, resulting in a buried BCM wafer.

Next, on the entire surface of the GaAs contact layer 105, a layered structure composed of two photoresists and a Ti film interposed therebetween is deposited, and then formed into stripes perpendicular to the direction of an optical waveguide, resulting in a multi-layer resist 106 with a prescribed striped pattern. Using the multi-layer resist 106 as a mask, the wafer is subjected to reactive ion beam etching. As a result, striped channels 120 perpendicular to the optical waveguide are formed in the wafer. The side walls of the striped channels 120 become resonator facets 107, as shown in FIG. 2b.

The above-described process of forming resonator facets by the use of dry etching is reported by Uchida et al., in "Preprints for the 32nd Annual Meeting of the Society of Applied Physics, Spring 1985 (1 P-ZB-8)".

After the formation of the resonator facets, the wafer is taken out into the ambient air, followed by the removal of the multi-layer resist 106. Then, an AlGaAs layer 108 which is a semiconductor crystal layer with a band gap larger than that of the n-Al$_{0.08}$Ga$_{0.92}$As active layer 103 is formed on each resonator facet 107 by vapor deposition such as metal organic chemical vapor deposition or molecular beam epitaxy, as shown in FIG. 2c.

Then, a p-sided electrode 109 and an n-sided electrode 110 are formed on the upper face of the GaAs contact layer 105 and on the bottom face of the n-GaAs substrate 101, respectively, as shown in FIG. 2c. Finally, the wafer is cleaved along each striped channel 120, and divided into a plurality of semiconductor laser devices. In this manner, a semiconductor laser device with large-band-gap layers on the resonator facets thereof is produced.

Another conventional method for producing this type of semiconductor laser device has been proposed which employs chemical etching to form resonator facets on a wafer. In this method, chemical etching is first performed to form resonator facets on a wafer, and then semiconductor layers with a band gap larger than that of an active layer are formed on the facets. This conventional process will be described in detail below.

FIGS. 3a to 3c are sectional views of a wafer taken along the direction of an optical waveguide, in the steps of the conventional process for producing a semiconductor laser device with a large-band-gap layer.

First, as shown in FIG. 3a, on a p-GaAs substrate 201, an n-GaAs current confining layer 202, a p-$Al_xGa_{1-x}As$ first cladding layer 203, a p-$Al_{0.08}Ga_{0.92}As$ active layer 204, an n-$Al_xGa_{1-x}As$ second cladding layer 205, an n-GaAs contact layer 206 and an n-$Al_zGa_{1-z}As$ layer 207 are successively grown by epitaxy, resulting in an inner striped BTRS wafer. The Al mole fraction z of the $Al_zGa_{1-z}As$ layer 207 is obtained by adding 0.1 to the Al mole fraction x of the $Al_xGa_{1-x}As$ first and second cladding layers 203 and 205.

Then, on the entire surface of the $Al_zGa_{1-z}As$ layer 207, a layered structure composed of two photoresists and a Ti film interposed therebetween is deposited, and then formed into stripes perpendicular to the direction of an optical waveguide, resulting in a multi-layer resist 208 with a prescribed striped pattern. Using the multi-layer resist 208 as a mask, the wafer is subjected to chemical etching by the use of a solution containing $H_2SO_4$, $H_2O_2$ and $H_2O$ in a volume ratio of 1:8:1. As a result, striped channels 220 perpendicular to the optical waveguide are formed in the wafer. The side walls of the striped channels 220 become resonator facets 209, as shown in FIG. 3b.

The above-described process of forming resonator facets on a wafer by chemical etching is reported by Wada et al., in "Preprints for the 45th Annual Meeting of the Society of Applied Physics, Autumn 1984 (13P-R-5)".

After the formation of the resonator facets, in the same manner as in the conventional process described with reference to FIGS. 2a to 2c, the wafer is taken out into the air, followed by the removal of the multi-layer resist 208. Then, an AlGaAs layer 210 which is a semiconductor crystal layer with a band gap larger than that of the p-$Al_{0.08}Ga_{0.92}As$ active layer 204 is formed on each resonator facet 209, as shown in FIG. 3c.

Thereafter, an n-sided electrode 212 and a p-sided electrode 211 are formed on the upper face of the $Al_zGa_{1-z}As$ layer 207 and on the bottom face of the p-GaAs substrate 201, respectively, also as shown in FIG. 3c. Finally, the wafer is cleaved along each striped channel and divided into a plurality of semiconductor laser devices. In this manner, a semiconductor laser device with large-band-gap layers on the resonator facets thereof is produced.

In the above-described conventional processes, the wafer on which resonator facets have been formed is taken out into the ambient air before a large-band-gap layer is formed on each facet. Thus, the resonator facets are oxidized while being exposed to the air. Large-band-gap layers are formed on the thus oxidized resonator facets. Because of the oxidized portions of the resonator facets, the semiconductor laser device produced by the conventional processes has a surface state at the interface between each resonator facet and the large-band-gap layer formed thereon, thereby causing deterioration in the resonator facet.

SUMMARY OF THE INVENTION

The method for the production of a semiconductor laser device according to the present invention, which overcomes the above-discussed and numerous other disadvantages and deficiencies of the prior art, comprises the steps of: growing a multi-layered structure containing an active layer for laser oscillation on a semiconductor substrate to form a wafer; etching the multi-layered structure to form a striped groove perpendicular to the direction of an optical waveguide, resulting in a pair of resonator facets; bringing the facets into contact with a sulfur-containing solution; subjecting the facets to heat treatment; growing a semiconductor layer on the surface of the facets, which has a band gap greater than that of the active layer; and cleaving the wafer along the striped groove to obtain a semiconductor laser device.

In a preferred embodiment, the aforementioned sulfur-containing solution is selected from the group consisting of undiluted $(NH_4)_2S$ solutions, aqueous $(NH_4)_2S$ solutions, undiluted $(NH_4)_2S_x$ solutions, aqueous $(NH_4)_2S_x$ solutions, undiluted $Na_2S$ solutions and aqueous $Na_2S$ solutions.

In a preferred embodiment, the aforementioned heat treatment is conducted at a temperature of 500° C. to 600° C.

In a preferred embodiment, the aforementioned semiconductor layer formed on the surface of the facets has a band gap increasing gradually with an increase in the distance from the facets.

Thus, the invention described herein makes possible the objective of providing a method for the production of a semiconductor laser device which has excellent resonator facets for emitting laser light so as to attain high reliability even when operated at a high output power level for a long period of time.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The method for the production of a semiconductor memory device according to this invention includes a surface treatment in which resonator facets formed by etching on a wafer are brought into contact with a solution containing sulfur, e.g., a solution of ammonium sulfide. Through this surface treatment, portions of the resonator facets which have been oxidized by being exposed to the ambient air are removed so that the resonator facets can be made clean. Also in this treatment, sulfur in the solution adheres to the clean resonator facets to protect them from another oxidization.

The wafer thus treated is placed in an apparatus such as one used for metal organic chemical vapor deposition or molecular beam epitaxy, after which the wafer is heated to such a temperature that the sulfur is removed through sublimation from the resonator facets. Thereafter, on the exposed clean resonator facets, semiconductor layers with a band gap larger than that of an active layer are grown.

In this way, in the method of this invention, a large-band-gap layer can be grown on a clean resonator facet having no oxidized portion. This eliminates the possibility that a surface state will arise at the interface between each resonator facet and the large-band-gap layer thereon in the resultant semiconductor laser device. Thus, the semiconductor laser device produced by the method of this invention has excellent resonator facets, thereby attaining high reliability even when operated at a high output power level for a long period of time.

This invention will be further illustrated by reference to the following example.

EXAMPLES

Figure 1A:
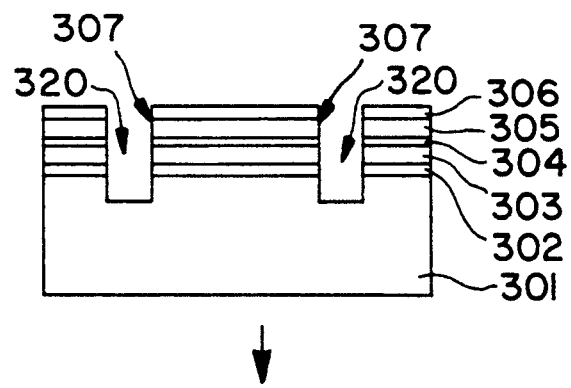
FIGS. 1a and 1c are sectional views of a wafer taken along the direction of an optical waveguide, in the steps of producing a semiconductor laser device according to this invention.
Figure 1B:
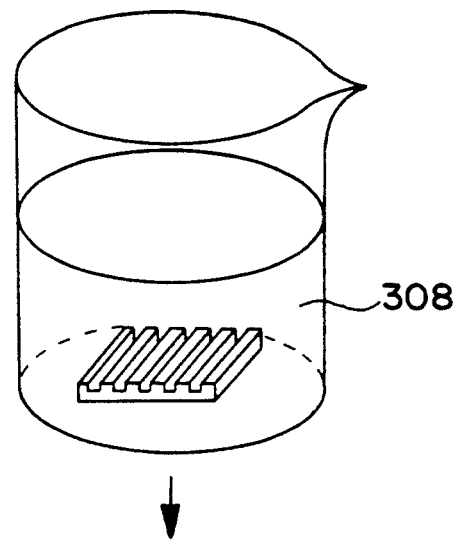
FIG. 1b is a perspective view of the wafer which is being subjected to a surface treatment according to this invention.
Figure 1C:
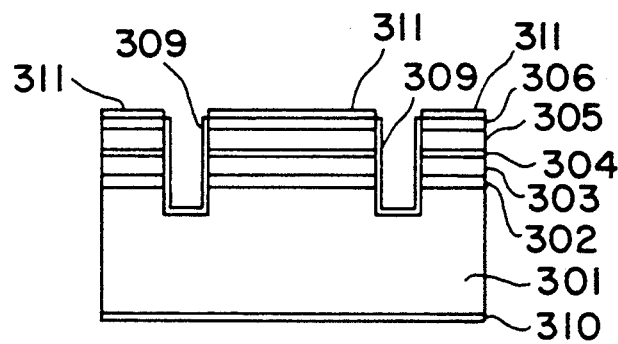
Figure 2A:
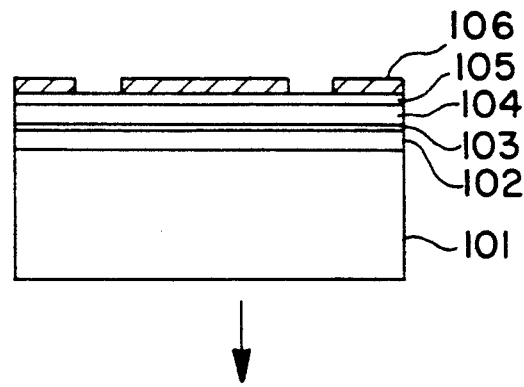
FIGS. 2a to 2c are sectional views of a wafer taken along the direction of an optical waveguide, in the steps of a conventional process for producing a semiconductor laser device.
Figure 2B:
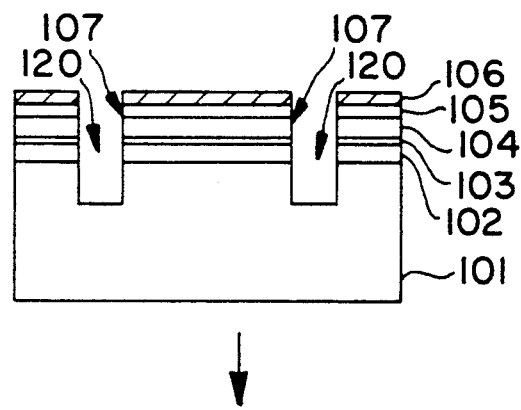
Figure 2C:
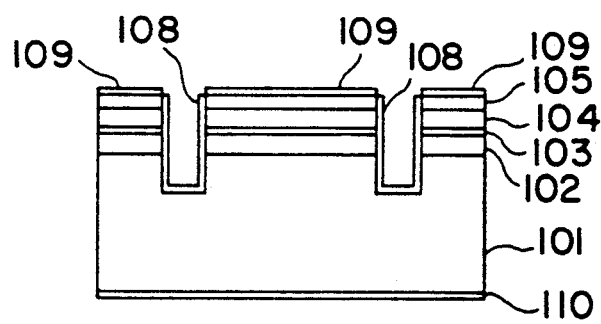
Figure 3A:
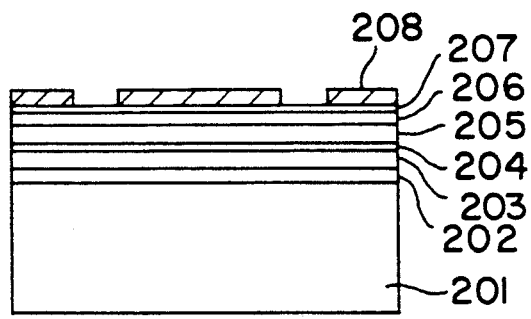
FIGS. 3a to 3c are sectional views of a wafer taken along the direction of an optical waveguide, in the steps of another conventional process for producing a semiconductor laser device.
Figure 3B:
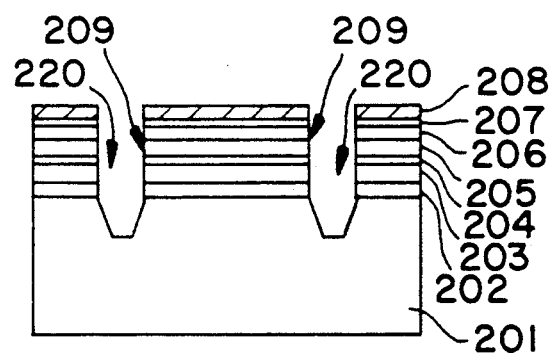
Figure 3C:
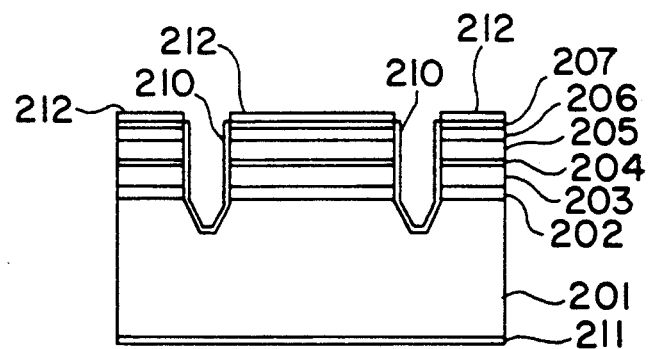

FIGS. 1a to 1c show the production of a semiconductor laser device according to a method of this invention.

First, on a p-GaAs substrate 301, an n-GaAs current confining layer 302, a p-$Al_{0.45}Ga_{0.55}As$ first cladding layer 303, a p-$Al_{0.15}Ga_{0.85}As$ active layer 304, an n-$Al_{0.45}Ga_{0.55}As$ second cladding layer 305 and a GaAs contact layer 306 are successively grown by epitaxy, resulting in an inner striped VSIS wafer.

Then, in the same manner as in the conventional processes described above, a resist with a prescribed striped pattern (not shown) is formed on the GaAs contact layer 306, after which the wafer is subjected to etching by the use of the resist as a mask. As a result of the etching, striped channels 320 perpendicular to the direction of an optical waveguide are formed in the wafer. The side walls of the striped channels 320 become resonator facets 307, as shown in FIG. 1a.

The wafer is then taken out into the ambient air, followed by the removal of the resist. While the wafer is exposed to the air, the resonator facets are likely to be oxidized. According to this invention, however, the oxidized portions of the resonator facets can be removed through a surface treatment as will be described below.

As shown in FIG. 1b, the wafer is immersed in a 10% $(NH_4)_2S$ aqueous solution 308 at a room temperature for 3 minutes. The wafer is then cleaned with pure water, and dried using $N_2$ gas. As a result, the portions of the resonator facets which have been oxidized by being exposed to the air are removed, so that the resonator facets can be made clean. Also in this treatment, sulfur adheres to the clean resonator facets so as to protect them from another oxidization.

The wafer thus treated is placed in an apparatus used for metal organic chemical vapor deposition, and then heated to a temperature of 500° to 600° C. in an atmosphere of $AsH_3$ gas, thereby removing the sulfur through sublimation from the resonator facets. Then, the wafer is heated to a temperature of 800° C., so that a non-doped $Al_{0.5}Ga_{0.5}As$ layer 309 having high resistance is grown on the clean resonator facets, as shown in FIG. 1c. The $Al_{0.5}Ga_{0.5}As$ layer 309 thus formed is a large-band-gap layer with a band gap larger than that of the p-$Al_{0.15}Ga_{0.85}As$ active layer 304.

During the above-described deposition, the $Al_{0.5}Ga_{0.5}As$ layer is also grown on the upper face of the GaAs contact layer 306. This portion of the $Al_{0.5}Ga_{0.5}As$ layer formed on the GaAs contact layer 306 is removed by selective etching. Then, an n-sided electrode 311 and a p-sided electrode 310 are formed on the upper face of the GaAs contact layer 306 and on the back face of the p-GaAs substrate 301, respectively.

The wafer is then cleaved along each striped channel 320, and divided into a plurality of chips. On the $Al_{0.5}Ga_{0.5}As$ layer 309 on one resonator facet 307 of each chip, an $Al_2O_3$ reflecting film with a 10% reflectance is formed, so that this resonator facet 307 of the chip becomes a front light-emitting facet. On the $Al_{0.5}Ga_{0.5}As$ layer 309 on the other resonator facet 307 of each chip, a layered reflecting film made of an $Al_2O_3$ film and an Si film and having a 75% reflectance is formed, so that this resonator facet 307 of the chip becomes a rear light-emitting facet.

In this way, a semiconductor laser device with large-band-gap layers ($Al_{0.5}Ga_{0.5}As$ layer 309) on its resonator facets (307) is produced.

The semiconductor laser device thus produced exhibited excellent reliability even when operated at a high output power level of 150 mW. Also, when this semiconductor laser device was operated for a long period of time, the resonator facets thereof did not deteriorate.

In the above-described example, metal organic chemical vapor deposition is used to form a large-band-gap layer on each resonator facet. Alternatively, large-band-gap layers can be formed by molecular beam epitaxy. In the latter case, a wafer placed in an apparatus used for molecular beam epitaxy is first heated to a temperature of 500° C. to 600° C. to remove sulfur from each resonator facet, and then heated to a temperature of 700° C. in a vacuum so as to grow a large-band-gap layer on each resonator facet.

Furthermore, the large-band-gap layer to be formed on each resonator facet may be a graded-band-gap layer which has a band gap increasing gradually with an increase in the distance from the resonator facet. In a semiconductor laser device having such graded-band-gap layers on the resonator facets thereof, carriers generated in the vicinity of the resonator facets are drawn strongly into the inside of the semiconductor crystals due to the drift caused by the grading of the band gap, thereby reducing leakage current from the active layer. This attains further reliability in the operation of the semiconductor laser device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of a semiconductor laser device which emits laser light from a facet, comprising the steps of:

growing a multi-layered structure containing an active layer for laser oscillation on a semiconductor substrate;

etching the multi-layered structure to form a striped groove perpendicular to the direction of an optical waveguide, resulting in a pair of resonator facets;

bringing the facets into contact with a sulfur-containing solution;

subjecting the facets to heat treatment;

growing a semiconductor layer on the surface of the facets, which has a band gap greater than that of the active layer;

cleaving the wafer along the striped groove to obtain a semiconductor laser device.

2. A method according to claim 1, wherein the sulfur containing solution is selected from the group consisting of undiluted $(NH_4)_2S$ solutions, aqueous $(NH_4)_2S$ solutions, undiluted $(NH_4)_2S_x$ solutions, aqueous $(NH_4)_2S_x$ solutions, undiluted $Na_2S$ solutions and aqueous $Na_2S$ solutions.

3. A method according to claim 1, wherein the heat treatment is conducted at a temperature of 500° C. to 600° C.

4. A method according to claim 1, wherein the semiconductor layer formed on the surface of the facets has a band gap increasing gradually with an increase in the distance from the facets.

5. A method according to claim 1, further comprising the step of forming a reflecting film on said semiconductor layer grown on the surface of said facets in order to create a front light-emitting facet and a rear light-emitting facet.

6. A method according to claim 5, whereins aid reflecting film on said front light-emitting facet and said rear light-emitting facet has a reflectance of approximately 10% and 75%, respectively.

* * * * *